(12) United States Patent
Xiong et al.

(10) Patent No.: US 8,114,727 B2
(45) Date of Patent: Feb. 14, 2012

(54) DISPOSABLE SPACER INTEGRATION WITH STRESS MEMORIZATION TECHNIQUE AND SILICON-GERMANIUM

(75) Inventors: Weize Xiong, Plano, TX (US); Zhiqiang Wu, Plano, TX (US); Xin Wang, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/549,862

(22) Filed: Aug. 28, 2009
(Under 37 CFR 1.47)

(65) Prior Publication Data

US 2011/0070703 A1    Mar. 24, 2011

Related U.S. Application Data

(60) Provisional application No. 61/092,763, filed on Aug. 29, 2008.

(51) Int. Cl.
*H01L 21/00* (2006.01)

(52) U.S. Cl. ........ 438/199; 438/201; 438/300; 438/301; 257/E21.206; 257/E21.444; 257/E21.639; 257/E27.062; 257/E27.066

(58) Field of Classification Search .......... 438/199–201, 438/231, 300–301; 257/E21.202, 206, 345, 257/444, 632–639, 27.062–27.064, 29.158
See application file for complete search history.

(56) References Cited

U.S. PATENT DOCUMENTS

| | | | | |
|---|---|---|---|---|
| 7,084,025 | B2* | 8/2006 | Phua et al. | 438/199 |
| 7,592,214 | B2* | 9/2009 | Ohta | 438/199 |
| 7,642,148 | B2* | 1/2010 | Nam et al. | 438/200 |
| 7,741,167 | B2* | 6/2010 | Beyer et al. | 438/199 |
| 7,745,890 | B2* | 6/2010 | Yu et al. | 257/413 |
| 7,755,144 | B2* | 7/2010 | Li et al. | 257/368 |
| 7,781,276 | B2* | 8/2010 | Lee et al. | 438/188 |
| 2006/0157797 | A1* | 7/2006 | Tateshita | 257/369 |
| 2007/0141797 | A1* | 6/2007 | Li | 438/301 |
| 2007/0264765 | A1* | 11/2007 | Lan et al. | 438/199 |

* cited by examiner

*Primary Examiner* — Michael Lebentritt
(74) *Attorney, Agent, or Firm* — Jacqueline J. Garner; Wade J. Brady, III; Frederick J. Telecky, Jr.

(57) ABSTRACT

An integrated process flow for forming an NMOS transistor (104) and an embedded SiGe (eSiGe) PMOS transistor (102) using a stress memorization technique (SMT) layer (126). The SMT layer (126) is deposited over both the NMOS transistor (104) and PMOS transistor (102). The portion of SMT layer (126) over PMOS transistor (102) is anisotropically etched to form spacers (128) without etching the portion of SMT layer (126) over NMOS transistor (104). Spacers (128) are used to align the SiGe recess etch and growth to form SiGe source/drain regions (132). The source/drain anneals are performed after etching the SMT layer (126) such that SMT layer (126) provides the desired stress to the NMOS transistor (104) without degrading PMOS transistor (102).

11 Claims, 7 Drawing Sheets

DISPOSABLE SPACER INTEGRATION WITH STRESS MEMORIZATION TECHNIQUE AND SILICON-GERMANIUM

RELATED APPLICATION

This application claims the priority of U.S. Provisional Application Ser. No. 61/092,763, filed Aug. 29, 2008, entitled "Disposable Spacer Integrations with SMT and SiGe".

This application is related to co-pending U.S. application Ser. No. 12/549,908, filed Aug. 28, 2009, and entitled "Novel Method to Improve Performance by Enhance Poly Gate Doping Concentration in an Embedded SiGe PMOS Process".

FIELD OF THE INVENTION

The invention is generally related to the field of forming transistors in semiconductor devices and more specifically to forming transistors with an embedded SiGe process and SMT (Stress Memorization Technique).

BACKGROUND OF THE INVENTION

Historically, most performance improvements in semiconductor field-effect transistors (FET) have been achieved by scaling down the relative dimensions of the device. This trend is becoming increasingly more difficult to maintain as the devices reach their physical scaling limits. As a consequence, advanced FETs and the complementary metal oxide semiconductor (CMOS) circuits in which they can be found are increasingly relying on strain engineering and specialty silicon-on-insulator substrates to achieve desired circuit performance.

One method of introducing compressive strain in a silicon channel region is to epitaxially grow a silicon-germanium (SiGe) material within recesses formed in the semiconductor body. The silicon germanium atom has a different lattice spacing than the silicon atom thereby imparting a compressive strain to the channel region under the gate. This is referred to as an embedded SiGe process.

Improved performance in transistors fabricated using an embedded SiGe process is desired.

SUMMARY OF THE INVENTION

This Summary is provided to comply with 37 C.F.R. §1.73, requiring a summary of the invention briefly indicating the nature and substance of the invention. It is submitted with the understanding that it will not be used to interpret or limit the scope or meaning of the claims.

The invention provides a novel disposable spacer integration with SMT and embedded SiGe (eSiGe) processes to improve transistor performance while minimizing mask count. After implanting the NSD (n-type source/drain region), an SMT layer is deposited over the structure. The SMT layer is then etched in the PMOS area to form a SiGe spacer without etching the SMT layer in the NMOS regions. Using the SiGe spacer, a recess is formed in the PMOS S/D regions and SiGe is grown in the recess.

An advantage of the invention is providing an embedded SiGe process that prevents PMOS transistor degradation from an SMT layer without using an additional mask.

Another advantage of the invention is providing an embedded SiGe process that allows the embedded SiGe S/D to be processed after S/D implant and anneal with a polysilicon gate.

This and other advantages will be apparent to those of ordinary skill in the art having reference to the specification in conjunction with the drawings.

DETAILED DESCRIPTION OF THE EMBODIMENTS

Figure 1A:
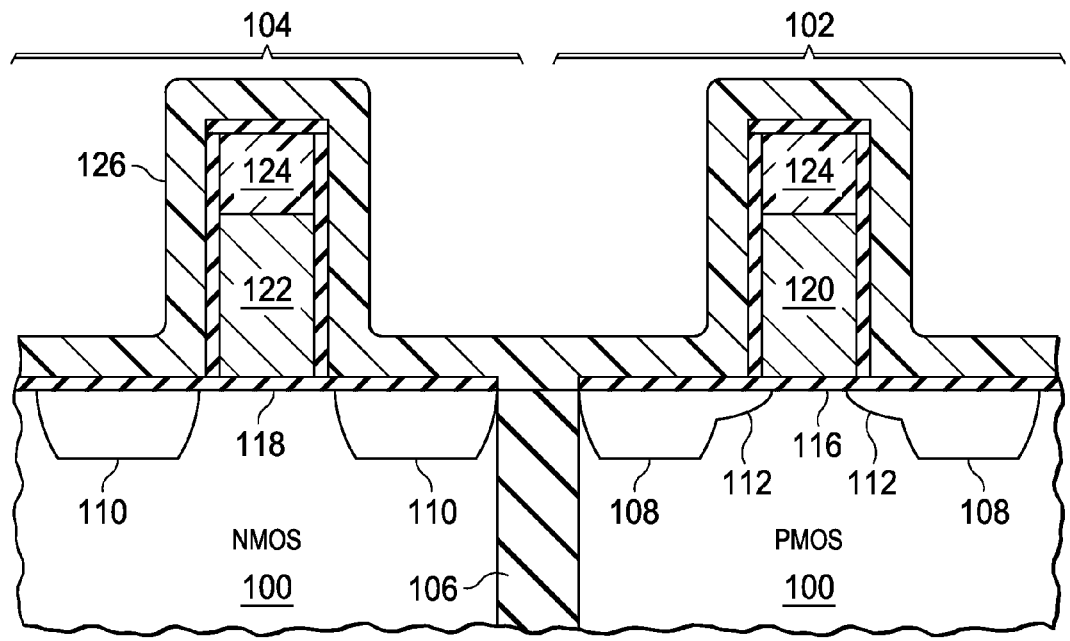
FIGS. 1A-1D are a cross-sectional diagrams of a PMOS transistor and an NMOS transistor at various stages of fabrication according to an embodiment of the invention.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The invention will now be described in conjunction with a partial CMOS fabrication sequence for forming an NMOS transistor and an embedded SiGe PMOS transistor. FIG. 1A illustrates a partially formed PMOS transistor 102 and a partially formed NMOS transistor 104. PMOS transistor 102 and NMOS transistor 104 are formed in a substrate 100. Substrate 100 is typically p-type single crystal silicon, but possibly a silicon-on-insulator (SOI) wafer which has a layer of single crystal silicon over a buried insulating layer, or a hybrid orientation technology (HOT) wafer which has regions of different crystal orientation for different components, or any other substrate which supports fabrication of integrated circuits. Isolation regions 106 isolate PMOS transistor 102 from NMOS transistors 104 as well as from other devices (not shown).

Partially fabricated PMOS transistor 102 and NMOS transistor 104 have been processed through the implant of source/drain regions (NSD 110). In a preferred embodiment, PMOS source/drain regions (PSD 108) have also been implanted. Although not required in a SiGe source/drain process flow, forming PSD 108 provides the advantage of allowing for a more heavily doped PMOS gate electrode 120. The drain extension regions, PLDD 112 and/or NLDD (not shown) may have also been implanted. Importantly, while PMOS transistor 102 and NMOS transistor 104 are processed through the source/drain implants, the source/drain anneals have not yet been performed. As shown in FIG. 1A, a PMOS gate dielectric 116 and an NMOS gate dielectric 118 are formed on the surface of the substrate 100. PMOS gate dielectric 116 and NMOS gate dielectric 118 may be formed concurrently or separately using the similar or dissimilar materials. For example, PMOS gate dielectric 116 and NMOS gate dielectric 118 may comprise silicon dioxide, nitrogen doped silicon dioxide, silicon oxy-nitride, hafnium oxide, layers of silicon dioxide and silicon nitride, or other insulating material and may, for example, be between 1 and 5 nanometers thick. PMOS gate electrode 120 is located over PMOS gate dielectric 116 and NMOS gate electrode 122 is located over NMOS gate dielectric 118. NMOS gate electrode comprises n-type polysilicon. PMOS gate electrode 120 comprises p-type polysilicon. PMOS gate electrode 120 and NMOS gate electrode 122 may be deposited concurrently but doped separately in conjunction with, for example, the formation the PSD regions 108 and NSD regions 110, respectively. A capping layer 124 may be formed over the PMOS gate electrode 120 and NMOS gate electrode 122.

PMOS gate electrode 120 may comprise highly doped p-type polysilicon. High polysilicon gate doping concentration improves on-state current and may be achieved by doping the electrode while forming PSD 108 even though the majority of dopant in PSD 108 will be removed by a subsequent SiGe recess etch. Advantageously, PMOS gate electrode 120 may be highly doped in this manner without excessively doping the final SiGe source/drain regions, thus avoiding a dopant overrun issue (e.g., increased leakage current, and/or increased SiGe relaxation caused by S/D implant).

Still referring to FIG. 1A, an SMT (stress memorization technique) layer 126 is deposited over the structure prior to performing any source/drain anneals (i.e., anneals typically performed after the source/drain implants described above to activate dopants). SMT layer 126 may, for example, comprise silicon nitride. Other examples include silicon boron nitride. SMT layer 126 comprises a material that causes a tensile stress in the channel region of the NMOS transistor 104 during an anneal. The thickness of SMT layer 126 may be in the range of 10 nm to 40 nm.

Figure 1B:
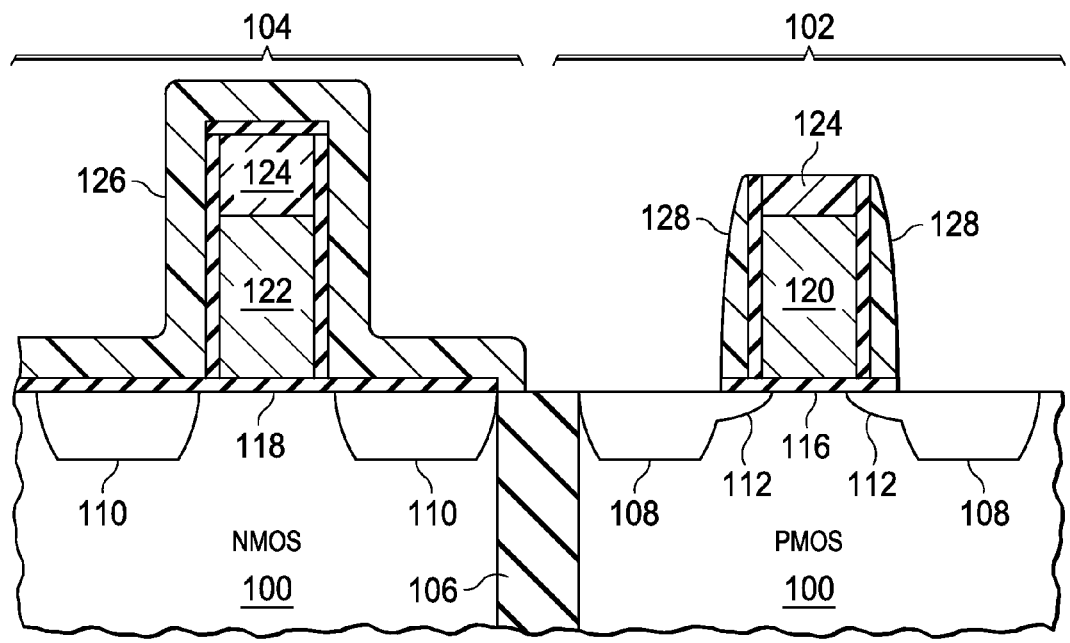

SMT may be used to boost NMOS performance. However, SMT reduces PMOS performance. Accordingly, it is desirable to remove the SMT layer 126 from the PMOS transistor 102. Referring to FIG. 1B, a portion of SMT layer 126 over PMOS transistor 102 is anisotropically etched to form SiGe spacers 128. For example, a masking pattern (not shown) may be formed exposing the PMOS transistor 102 and protecting the NMOS transistor 104. The exposed portions of SMT layer 126 are then etched using, for example, a etch chemistry comprising CH$_3$F. The result is that SMT layer 126 remains in full over NMOS transistor 104 but remains only as a SiGe spacer 128. By using the SMT layer 126 to form the SiGe spacer 128, a masking step is eliminated versus using one mask to selectively remove the SMT layer, removing that mask, depositing and etching to form a separate SiGe spacer and using another mask for the recess etch.

Figure 1C:
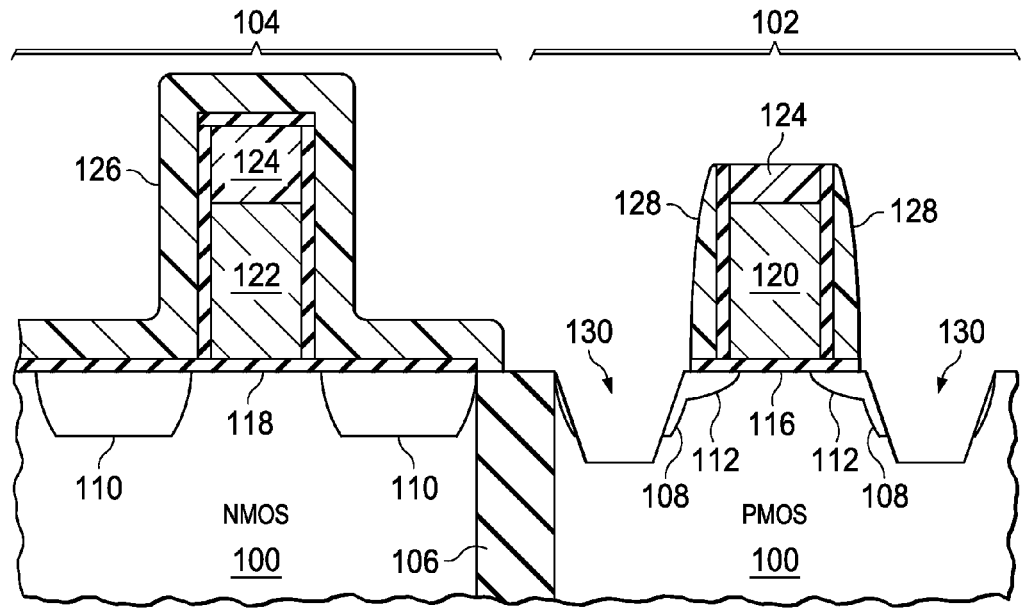

Referring to FIG. 1C, recesses 130 are formed in the PSD regions using the SiGe spacers 128 to align the recesses 130 from the PMOS gate electrode 120. The SMT layer 126, still covering the NMOS transistor, servers as a hard mask to prevent the recess region from forming in the NMOS transistor 104. In one realization of the instant embodiment, the recess process may include a fluorine containing RIE process. Other processes for forming the recesses 130 are within the scope of the instant embodiment. The recesses 130 are deeper that PSD regions 108 and may be between 50 and 120 nanometers deep. In one realization, the recesses 130 may be between 70 and 100 nanometers deep. During the silicon recess etch, PMOS gate electrode 120 is protected from the etch by capping layer 124. This etch removes silicon as well as at least a majority of the dopant implanted during the optional PMOS source/drain implant. Consequently, the effects of the high dopant dose and energy needed to provide a highly doped PMOS gate electrode 120 are mitigated and/or eliminated from the source/drain regions.

Either before or after the formation of recesses 130, a S/D anneal is performed to activate the dopants. The anneal may be performed at a temperature of 1000° C. to 1050° C. using a RTA (rapid thermal anneal) for a few seconds or laser anneal at 1200° C.-1300° C. for a few mili-seconds. Because the SMT layer 126 is present over NMOS transistor 104 during the anneal, stress is imparted to the NMOS channel region. Because SMT layer 126 is not present over PMOS transistor 102, the tensile stress is avoided thus avoiding any associated degradation from tensile stress in the PMOS channel region.

Figure 1D:
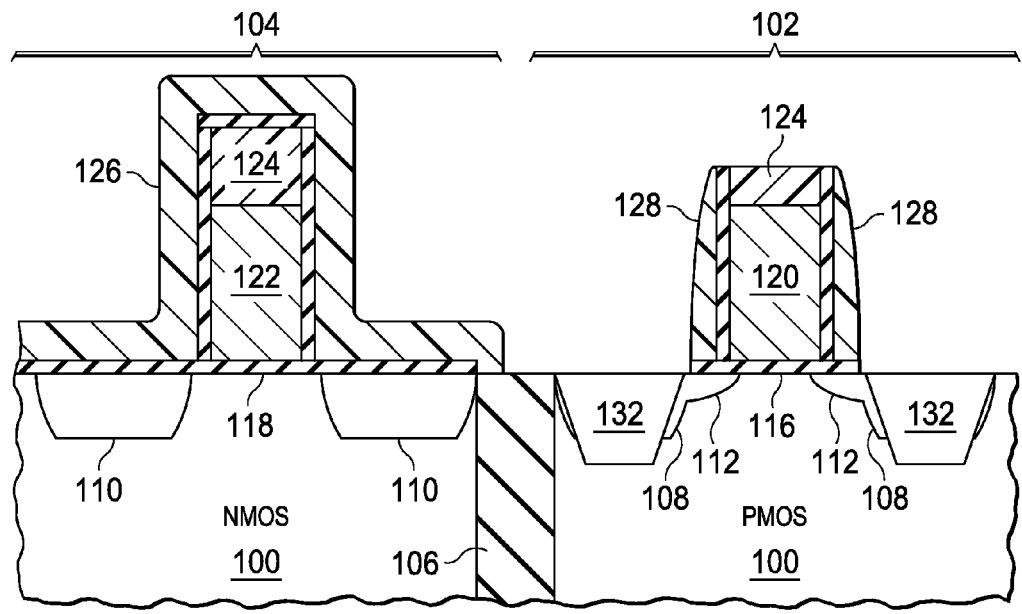

In a first embodiment of the invention, recesses 130 are then filled with SiGe to form embedded SiGe source/drain (S/D) regions 132 as shown in FIG. 1D. By performing the S/D anneal prior to filling the recesses with SiGe, the chances of SiGe relaxation are reduced. The SiGe is deposited by epitaxial deposition into recesses 130 to form S/D regions 132. S/D regions 132 may be in-situ doped during deposition. For example the substrate 100 may be heated to a temperature between 600 C and 700 C, while exposing an existing top surface of the substrate 100 to an epitaxial growth ambient containing silicon, germanium, boron and possibly carbon. This epitaxial growth ambient may be formed, for example, by flowing at least 5 slm of hydrogen gas, flowing between 50 standard cubic centimeters per minute (sccm) and 150 sccm of dichlorosilane gas, flowing between 30 sccm and 200 sccm of a gas mixture of between 5 and 10 percent germane gas and a carrier gas such as hydrogen, flowing between 50 sccm and 200 sccm of a gas mixture of between 0.25 percent and 2 percent of methylsilane and a carrier gas such as hydrogen, flowing between 50 sccm and 100 sccm hydrogen chloride gas, and flowing between 50 sccm and 200 sccm of a gas mixture of between 0.5 percent and 1 percent of diborane and a carrier gas such as hydrogen, into the epitaxial growth ambient at a pressure between 5 torr and 20 torr. In one realization of the instant embodiment, the substrate 100 may be heated to a temperature between 640 C and 660 C. In one realization of the instant embodiment, a germanium content of the S/D regions 132 may be between 20 atomic percent and 30 atomic percent. A carbon density of the source/drain regions 106 is between $5\times10^{19}$ and $1\times10^{20}$ atoms/cm$^3$ and a boron density is at least $5\times10^{19}$ atoms/cm$^3$. Other methods known in the art for forming embedded SiGe source/drain regions may alternatively be used to form SiGe S/D regions 132.

Processing may continue as is known in the art with the removal of capping layer124, formation of silicide regions at the surface of the gate electrodes 120, 122 and source/drain regions 110, 132, the formation of contacts and interconnect layers as well as packaging of the device.

Figure 2A:
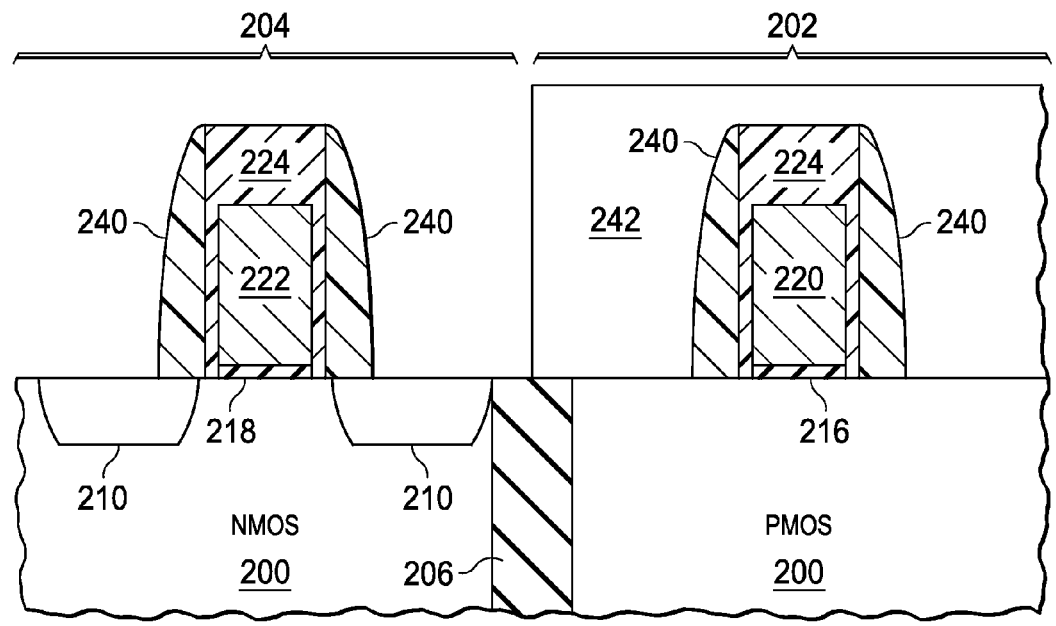
FIG. 2A-2I are cross-sectional diagrams of a PMOS transistor and an NMOS transistor integrated into a preferred process flow at various stages of fabrication according to another embodiment of the invention.

A process for forming CMOS transistors in the embedded SiGe flow with SMT according to another embodiment of the invention will now be discussed with reference to FIGS. 2A-2I. Substrate 200 is processed through the formation of sidewall spacers 240, as shown in FIG. 2A. For example, isolation regions 206 may be formed by a shallow trench isolation (STI) process sequence, in which trenches, commonly 200 to 500 nanometers deep, are etched into the substrate 100, electrically passivated, commonly by growing a thermal oxide layer on sidewalls of the trenches, and filled with insulating material, typically silicon dioxide, commonly by a high density plasma (HDP) process or an ozone based thermal chemical vapor deposition (CVD) process, also known as the high aspect ratio process (HARP). Isolation regions 206 isolate an area defined for PMOS transistor 202 from NMOS transistor 204 as well as from other devices to be formed in substrate 200. PMOS gate dielectric 216 and NMOS gate dielectric 218, typically silicon dioxide, nitrogen doped silicon dioxide, silicon oxy-nitride, hafnium oxide, layers of silicon dioxide and silicon nitride, or other insulating material, between 1 and 5 nanometers thick, are formed on a top surface of substrate 200, using known methods of gate dielectric layer formation. Material for PMOS gate electrode 220 and NMOS gate electrode 222, typically undoped polysilicon is deposited over gate dielectrics 216 and 218. Hard mask 224 is deposited over the material for gate electrode 220 and 222. The hard mask may, for example, comprise silicon nitride. The gate dielectrics 216, 218, material for gate electrodes 220 and 222 and hard mask 224 are then patterned and etched as shown in FIG. 2A.

Still referring to FIG. 2A, sidewall spacers 240 are formed on the sidewalls of the gate electrodes 120 and 122, typically by deposition of one or more conformal layers of silicon nitride and/or silicon dioxide followed by removal of the conformal layer material from the horizontal surfaces by known anisotropic etching methods, leaving the conformal layer material on the lateral surfaces of gate electrodes 120 and 122.

A masking layer 242 is formed on the surface of substrate 200 using conventional photolithographic processes. Masking layer 242 exposes the area for NMOS transistor 204 while covering PMOS transistor 202. An n-type S/D implant is performed to form NSD regions 210. Masking layer 242 is then removed.

Figure 2B:
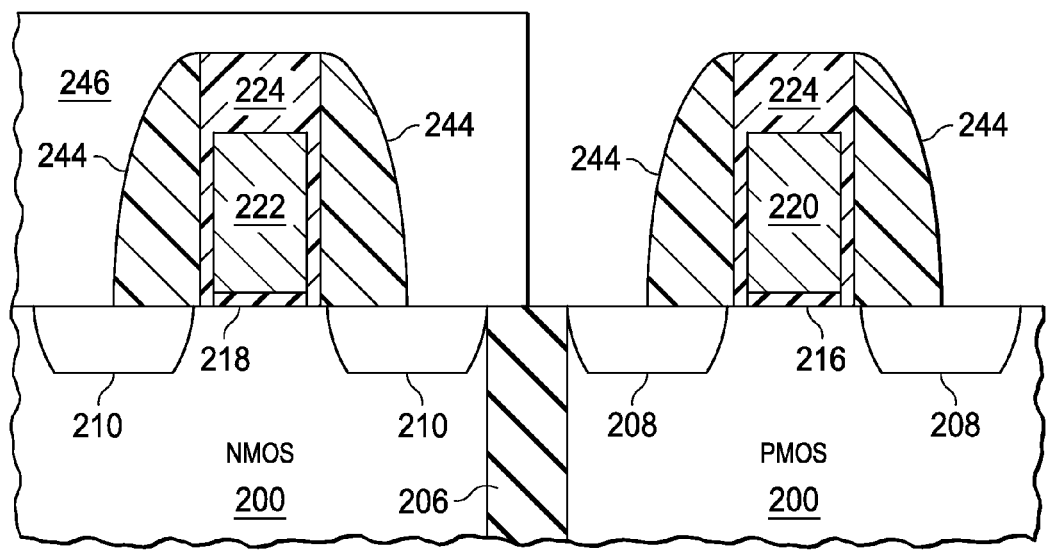

Additional spacer material may optionally then be deposited and anisotropically etched to form sidewall spacers 244, as shown in FIG. 2B. Sidewall spacers 244 are used to space source/drain regions further from the PMOS gate electrode 220. A masking layer 246 is then formed on the surface of the substrate using conventional photolithographic processes. Masking layer 26 exposes the area for PMOS transistor 202 while covering NMOS transistor 204.

Instead of forming recesses in substrate 200 for the SiGe source/drain regions immediately after forming sidewall spacers 244, a PMOS source/drain implant is performed. Referring to FIG. 2B, p-type dopant is implanted into the substrate 200, thus forming PSD regions 208 in the source/drain areas of PMOS transistor 202. PMOS gate electrode 220 is preferably doped using this implant as well. The dopant energy and dose may be selected to achieve a high dopant level in PMOS gate electrode 220 for improved transistor performance without the need to balance the gate doping level with the desired source/drain dopant level. For example, boron, sometimes partly in the form $BF_2$, and possibly indium and/or gallium, may be implanted at a total dose between $3 \cdot 10^{14}$ and $2 \cdot 10^{16}$ atoms/cm$^2$. Importantly, NSD regions 210 and PSD regions 208 are not annealed after implant until later in the process flow.

Figure 2C:
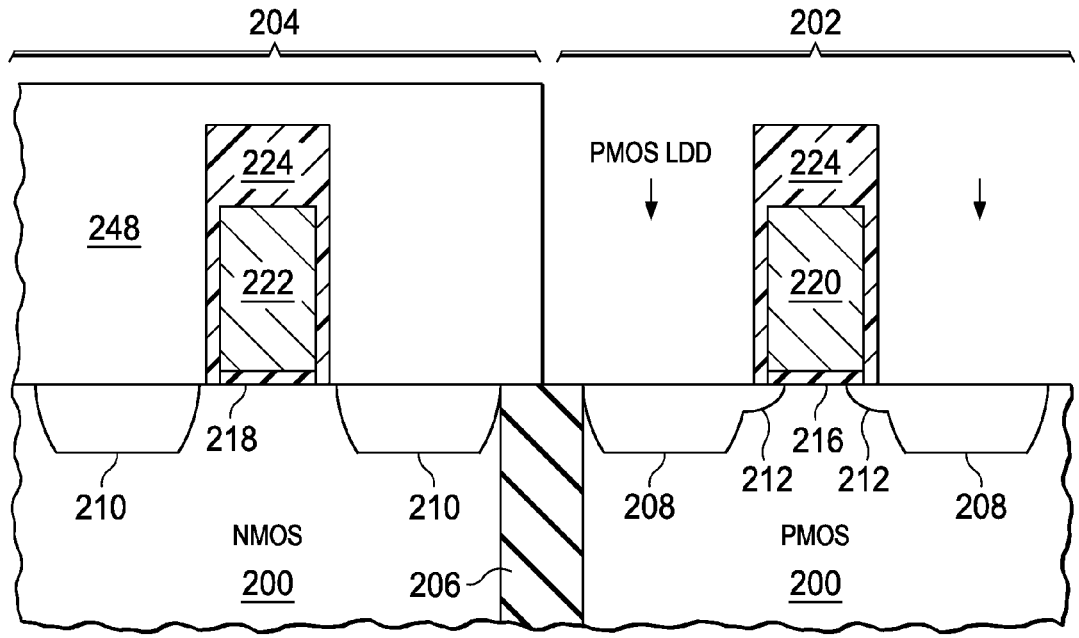

Referring to FIG. 2C, PLDD regions 212 may be formed next. After masking layer 246 and spacers 244 are removed, a new masking layer 248 is formed using conventional photolithographic processes. Masking layer 248 exposes the area for PMOS transistor 202 while covering NMOS transistor 204. P-type dopant is then implanted to form PLDD regions 212. After the implant, masking layer 248 is removed. PLDD regions 212 may alternatively be formed at a different point in the process flow, for example, prior to forming PSD regions 208. NLDD regions (not shown in FIG. 2C) may be formed at this point, prior to forming PLDD regions 212, prior to forming NSD regions 210 or at other points in the process as is known in the art. In one preferred embodiment, NLDD regions are formed subsequently in the process flow as discussed further below. If formed, PLDD regions 212 and NLDD regions are not annealed after implant until later in the process flow.

Figure 2D:
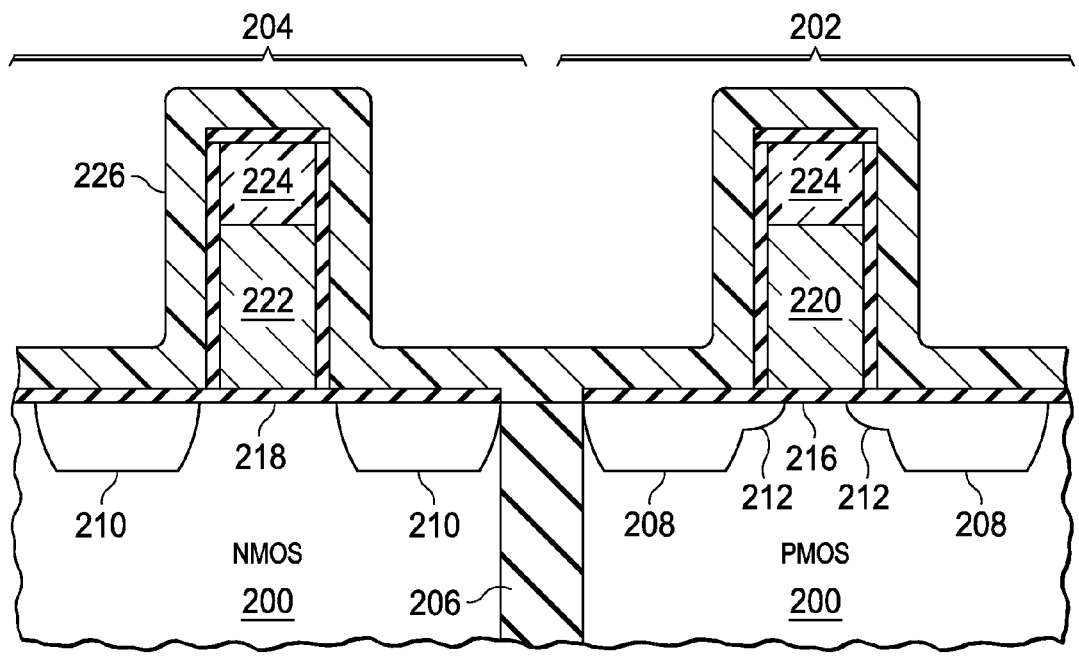

Referring to FIG. 2D, a first SMT layer 226 is deposited over the structure prior to performing any source/drain anneals (i.e., anneals typically performed after the source/drain implants described above to activate dopants). First SMT layer 226 may, for example, comprise silicon nitride. Other examples include silicon boron nitride. First SMT layer 226 comprises a material that causes a tensile stress in the channel region of the NMOS transistor 204 during an anneal. The thickness of first SMT layer 226 may be in the range of 10 nm to 40 nm.

Figure 2E:
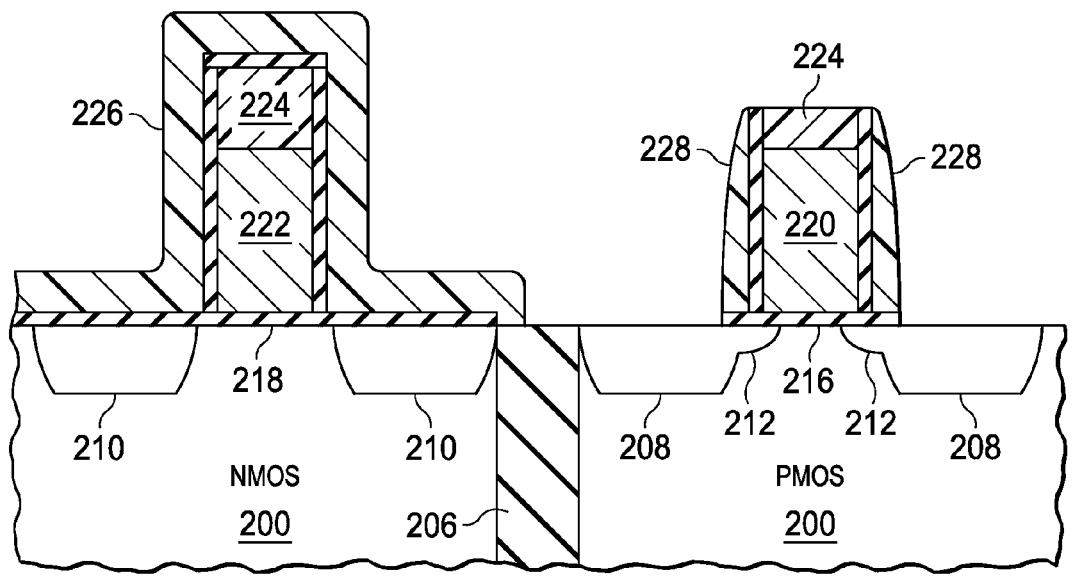

SMT may be used to boost NMOS performance. However, SMT reduces PMOS performance. Accordingly, it is desirable to remove the first SMT layer 226 from the PMOS transistor 202 prior to performing the S/D anneals. Referring to FIG. 2E, a portion of first SMT layer 226 over PMOS transistor 202 is anisotropically etched to form SiGe spacers 228. For example, a masking pattern (not shown) may be formed exposing the PMOS transistor 202 and protecting the NMOS transistor 204. The exposed portions of first SMT layer 226 are then etched using, for example, a etch chemistry comprising $CH_3F$. The result is that first SMT layer 226 remains in full over NMOS transistor 204 but remains only as a SiGe spacer 228. By using the first SMT layer 226 to form the SiGe spacer 228, a masking step is eliminated versus using one mask to selectively remove the SMT layer, removing that mask, depositing and etching to form a separate SiGe spacer and using another mask for the recess etch.

After forming SiGe spacers 228, recesses, similar to recesses 130 of FIG. 1C, are formed in the PSD regions using the SiGe spacers 228 to align the recesses from the PMOS gate electrode 220. The SMT layer 226 now still covers the NMOS transistor and servers as a hard mask to prevent the recess region from forming in the NMOS transistor. During the silicon recess etch, PMOS gate electrode 220 is protected from the etch by capping layer 224. This etch removes silicon as well as at least a majority of the dopant implanted during the source/drain implant. Consequently, the effects of the high dopant dose and energy needed to provide a highly doped PMOS gate electrode 220 are mitigated and/or eliminated from the source/drain regions.

Either before or after the formation of the recesses, a S/D anneal is performed to activate the dopants. The anneal may be performed at a temperature of 1000° C. to 1050° C. using a RTA (rapid thermal anneal) for a few seconds or laser anneal at 1200° C.-1300° C. for a few mili-seconds. Because the SMT layer 226 is present over NMOS transistor 204 during the anneal, stress is imparted to the NMOS channel region. Because SMT layer 226 is not present over PMOS transistor 202, the tensile stress is avoided thus avoiding any associated degradation from tensile stress in the PMOS channel region.

Figure 2F:
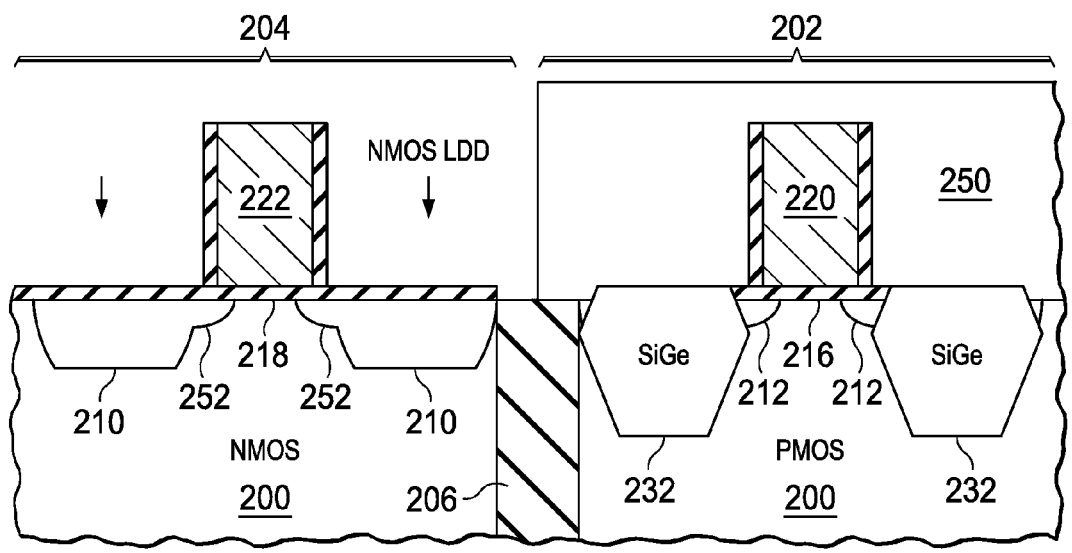

In one embodiment of the invention, the recesses are then filled with SiGe to form embedded SiGe source/drain (S/D) regions 232 as shown in FIG. 2F. By performing the S/D anneal prior to filling the recesses with SiGe, the chances of SiGe relaxation are reduced. The SiGe is deposited by epitaxial deposition into the recesses to form S/D regions 232. S/D regions 232 may be in-situ doped during deposition. For example the substrate 100 may be heated to a temperature between 600 C and 700 C, while exposing an existing top surface of the substrate 200 to an epitaxial growth ambient containing silicon, germanium, boron and possibly carbon. This epitaxial growth ambient may be formed, for example, by flowing at least 5 slm of hydrogen gas, flowing between 50 standard cubic centimeters per minute (sccm) and 150 sccm of dichlorosilane gas, flowing between 30 sccm and 200 sccm of a gas mixture of between 5 and 10 percent germane gas and a carrier gas such as hydrogen, flowing between 50 sccm and 200 sccm of a gas mixture of between 0.25 percent and 2 percent of methylsilane and a carrier gas such as hydrogen, flowing between 50 sccm and 100 sccm hydrogen chloride gas, and flowing between 50 sccm and 200 sccm of a gas mixture of between 0.5 percent and 1 percent of diborane and a carrier gas such as hydrogen, into the epitaxial growth ambient at a pressure between 5 torr and 20 torr. In one realization of the instant embodiment, the substrate 200 may be heated to a temperature between 640 C and 660 C. In one realization of the instant embodiment, a germanium content of the S/D regions 232 may be between 20 atomic percent and 30 atomic percent. A carbon density of the source/drain regions 106 is between $5 \times 10^{19}$ and $1 \times 10^{20}$ atoms/cm$^3$ and a boron density is at least $5 \times 10^{19}$ atoms/cm$^3$. Other methods known in the art for forming embedded SiGe source/drain regions may alternatively be used to form SiGe S/D regions 232.

Figure 2G:
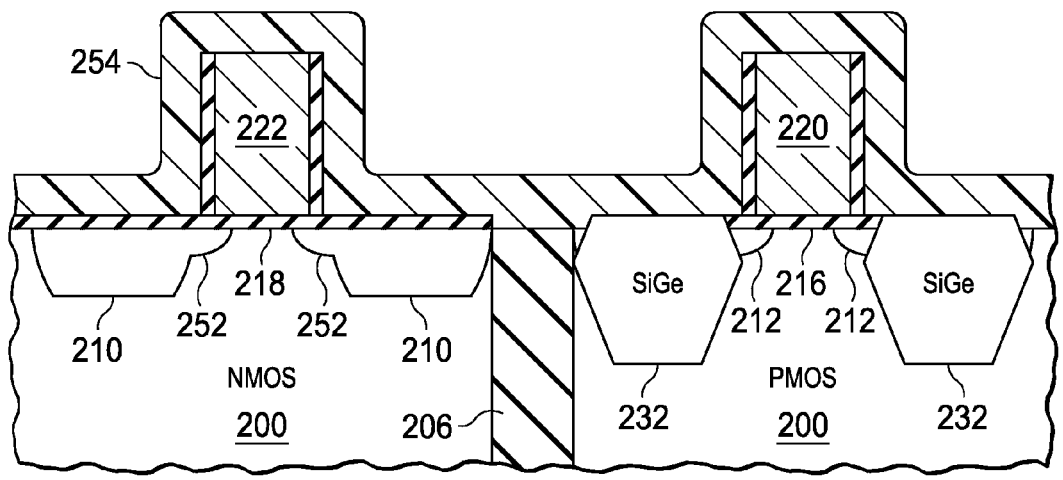
Figure 2H:
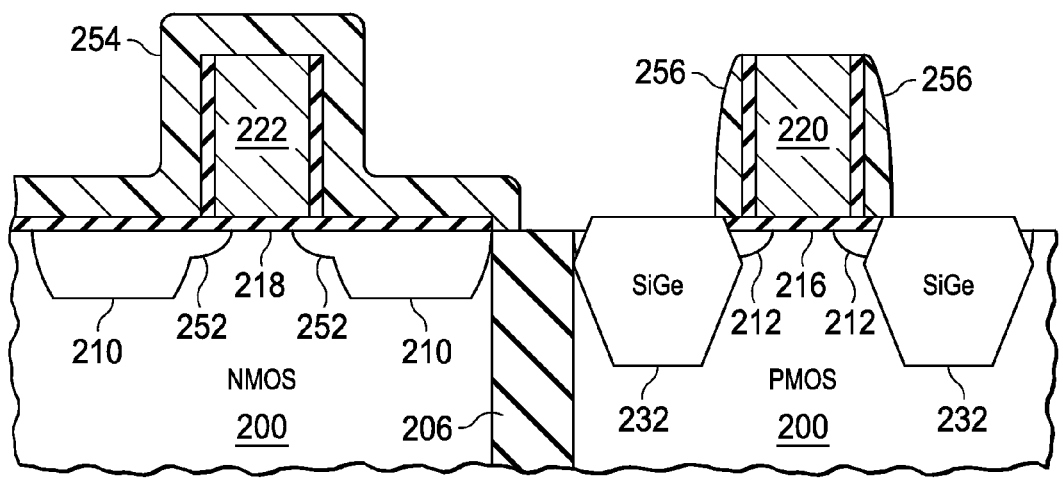

If NLDD regions 252 have not been formed previously, they may be incorporated at this point in the process. For example, after forming SiGe S/D regions 232 and removing SMT layer 226, a masking layer 250 may be formed covering PMOS transistor 202 and exposing NMOS transistor 204, as shown in FIG. 2F. Next, n-type dopant may be implanted to form NLDD regions 252. Masking layer 250 is then removed. Prior to performing an anneal to activate the NLDD dopant, a second SMT layer 254 may be deposited as shown in FIG. 2G. Similar to the first SMT layer 226, the second SMT layer 254 may be anisotropically etched in the PMOS region to form spacers 256 as shown in FIG. 2H. Second SMT layer 254 remains a conformal covering over NMOS transistor 204. After spacers 256 have been formed, the structure may be annealed to activate the NLDD 252 dopant. The anneal may be performed at a temperature of 1000° C. to 1050° C. using a RTA (rapid thermal anneal) for a few seconds or laser anneal at 1200° C.-1300° C. for a few mili-seconds. Because the SMT layer 254 is present over NMOS transistor 204 during the anneal, stress is imparted to the NMOS channel region. Because SMT layer 254 is not present over PMOS transistor 202, the tensile stress is avoided thus avoiding any associated degradation from tensile stress in the PMOS channel region.

Figure 2I:
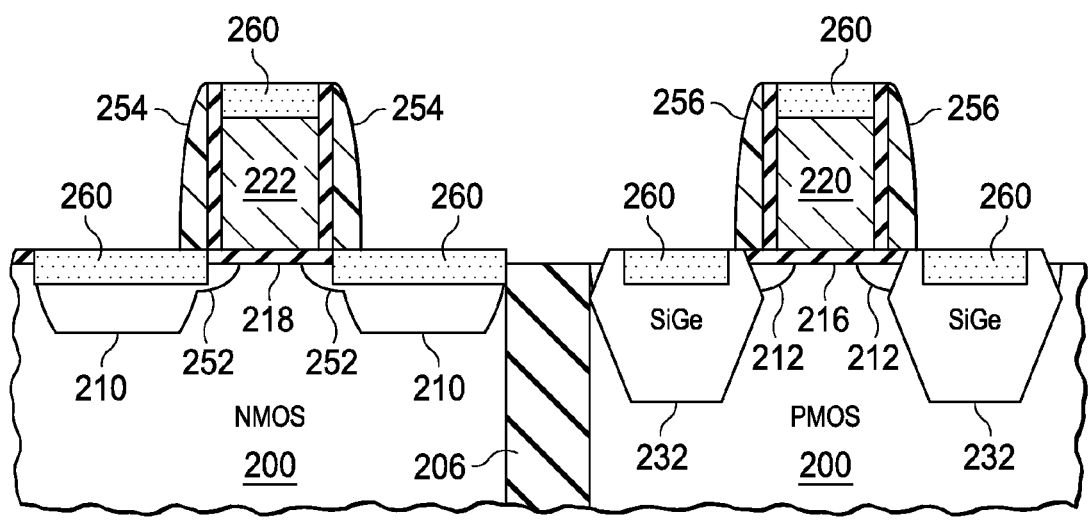

Processing may continue as is known in the art with the removal of SMT layer 254. Silicide regions 260 may be formed at the surface of the PMOS gate electrode 220 and NMOS gate electrode 222 as well as at the surface of NSD regions 210 and SiGe S/D regions 232 as shown in FIG. 2I. This may be followed by the formation of contacts and interconnect layers as well as packaging of the device.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

The invention claimed is:

1. A method of fabricating an integrated circuit comprising the steps of:
    forming stress memorization technique (SMT) layer over a first transistor area and a second transistor area;
    anisotropically etching a first portion of said SMT layer over said first transistor area to form spacers in said first transistor area without etching a second portion of said SMT layer over said second transistor area; and
    then, annealing the first and second transistors areas such that a stress is imparted in a channel region of the second transistor area due to the presence of the second portion of the SMT layer over the second transistor area during the anneal.

2. The method of claim 1, wherein said first transistor area is a PMOS transistor area and said second transistor area is an NMOS transistor area.

3. The method of claim 1, further comprising the step of forming a masking layer over said second transistor area that exposes said first transistor area, wherein said masking layer masks said second transistor area from said anisotropically etching step.

4. The method of claim 1, further comprising the steps of:
    implanting said first transistor area with a first source/drain dopant prior to forming said SMT layer; and
    implanting said second transistor area with a second source/drain dopant prior to forming said SMT layer.

5. The method of claim 4, further comprising the steps of:
    etching a recess in said first transistor area using said spacer to align the recess from a gate electrode in said first transistor area;
    epitaxially depositing SiGe in said recess to form a SiGe source/drain.

6. A method of fabricating an integrated circuit, comprising the steps of:
    providing a partially fabricated substrate having a PMOS gate dielectric and a PMOS gate electrode formed in a PMOS transistor area and an NMOS gate dielectric and an NMOS gate electrode formed in an NMOS transistor area;
    implanting n-type dopant to form an implanted NMOS source/drain region in said NMOS transistor area of said substrate;
    before activating said n-type dopant, depositing a first stress memorization technique (SMT) layer over said NMOS transistor area and said PMOS transistor area;
    etching a first portion of said first SMT layer in said PMOS transistor area to form first spacers in said PMOS transistor area without etching a second portion of said first SMT layer over said NMOS transistor area;
    after etching said first portion of said first SMT layer, annealing to activate said n-type dopant, wherein the second portion of the first SMT layer is present during the anneal and imparts a stress to a channel region of the NMOS transistor area;
    etching a recess in said PMOS transistor area using said first spacers to align said recess; and
    epitaxially depositing SiGe in said recess to form a SiGe source/drain in said PMOS transistor area.

7. The method of claim 6, further comprising the steps of:
    implanting a PLDD region in said PMOS transistor area prior to forming said SMT layer, wherein said annealing step activates dopant in said PLDD region; and
    implanting an NLDD region in said NMOS transistor area.

8. The method of claim 7, further comprising the steps of:
    depositing a second SMT layer after said epitaxially depositing SiGe step;
    etching a first portion of said second SMT layer in said PMOS transistor area to form second spacers in said PMOS transistor area without etching a second portion of said second SMT layer over said NMOS transistor area;
    after forming said second spacers, annealing to activate dopants implanted into said NLDD region.

9. A method of fabricating an integrated circuit, comprising the steps of:
proviiding a partially fabricated substrate having a PMOS gate dielectric and a PMOS gate electrode formed in a PMOS transistor area and an NMOS gate dielectric and an NMOS gate electrode formed in an NMOS transistor area;
implanting n-type dopant to form an implanted NMOS source/drain region in said NMOS transistor area of said substrate;
implanting p-type dopant to form an implanted PMOS source/drain region in said PMOS transistor area of said substrate;
before activating said n-type dopant and said p-type dopant, depositing a stress memorization technique (SMT) layer over said NMOS transistor area and said PMOS transistor area;
etching a first portion of said SMT layer in said PMOS transistor area to form first spacers in said PMOS transistor area without etching a second portion of said SMT layer over said NMOS transistor area;
after etching said first portion of said SMT layer, annealing to activate said n-type dopant and said p-type dopant, wherein the second portion of the first SMT layer is present during the anneal and imparts a stress to a channel region of the NMOS transistor area;
etching a recess through said PMOS source/drain region using said first spacers to align said recess; and
epitaxially depositing SiGe in said recess to form a SiGe source/drain in said PMOS transistor area.

10. The method of claim 9, further comprising the steps of:
implanting a PLDD region in said PMOS transistor area prior to forming said SMT layer, wherein said annealing step activates dopant in said PLDD region; and
implanting an NLDD region in said NMOS transistor area.

11. The method of claim 10, further comprising the steps of:
depositing a second SMT layer after said epitaxially depositing SiGe step;
etching a first portion of said second SMT layer in said PMOS transistor area to form second spacers in said PMOS transistor area without etching a second portion of said second SMT layer over said NMOS transistor area;
after forming said second spacers, annealing to activate dopants implanted into said NLDD region.

\* \* \* \* \*